(12) United States Patent
Henschel

(10) Patent No.: US 10,535,933 B2
(45) Date of Patent: Jan. 14, 2020

(54) CONNECTION ELEMENT FOR AN ELECTRONIC COMPONENT ARRANGEMENT AND PROCESS TO PRODUCE THE SAME

(71) Applicant: BIOTRONIK SE & Co. KG, Berlin (DE)

(72) Inventor: Martin Henschel, Berlin (DE)

(73) Assignee: BIOTRONIK SE & Co. KG (DE)

(*) Notice: Subject to any disclaimer, the term of this patent is extended or adjusted under 35 U.S.C. 154(b) by 294 days.

(21) Appl. No.: 15/481,586

(22) Filed: Apr. 7, 2017

(65) Prior Publication Data
US 2017/0294724 A1 Oct. 12, 2017

(30) Foreign Application Priority Data
Apr. 8, 2016 (DE) .................. 10 2016 106 482

(51) Int. Cl.
*H01R 12/59* (2011.01)
*H01R 4/02* (2006.01)
(Continued)

(52) U.S. Cl.
CPC .......... *H01R 12/592* (2013.01); *H01R 4/029* (2013.01); *H01R 43/0221* (2013.01);
(Continued)

(58) Field of Classification Search
CPC ...... H05K 1/18; H05K 3/3405; H05K 3/3415; H05K 3/3442; H05K 3/328; H01R 4/029;
(Continued)

(56) References Cited

U.S. PATENT DOCUMENTS 3,569,797 A * 3/1971 Simmons .......... H01L 23/49551
257/674
3,689,684 A * 9/1972 Cox, Jr. .............. H01L 21/4853
174/261

(Continued)

FOREIGN PATENT DOCUMENTS

DE 34 40 925 A1 5/1986
EP 0 893 945 A1 1/1999
(Continued)

OTHER PUBLICATIONS

European Search Report, Appln. No. 17165000.5-1803, dated Sep. 4, 2017.

*Primary Examiner* — Carl J Arbes
(74) *Attorney, Agent, or Firm* — Craig A. Fieschko, Esq.; DeWitt LLP

(57) ABSTRACT

A connection element for an electronic component assembly includes a support, a first contact pad, and a second contact pad. The first contact pad and the second contact pad are electrically connected. A first contact conductor has a first conductor surface electrically connected to the first contact pad at a first section, and is configured to form a welded connection in a second section of the first conductor surface, and/or on the second conductor surface. The invention also relates to an electronic component assembly which includes such a connection element, and which has at least one component welded to the contact conductor.

20 Claims, 8 Drawing Sheets

(51) Int. Cl.
*H01R 43/02* (2006.01)
*H01R 43/16* (2006.01)
*H05K 3/32* (2006.01)

(52) U.S. Cl.
CPC ......... *H01R 43/0256* (2013.01); *H01R 43/16* (2013.01); *H05K 3/328* (2013.01); *H01R 2201/12* (2013.01)

(58) Field of Classification Search
CPC .............. H01R 12/592; H01R 43/0221; H01R 43/0256; H01R 43/16; H01R 2201/12
See application file for complete search history.

(56) References Cited

U.S. PATENT DOCUMENTS

| | | | | |
|---|---|---|---|---|
| 3,750,252 A | * | 8/1973 | Landman | H01R 12/57 228/180.21 |
| 4,252,864 A | * | 2/1981 | Coldren | H01L 23/049 174/529 |
| 4,371,912 A | * | 2/1983 | Guzik | H05K 3/3405 228/180.21 |
| 4,503,609 A | * | 3/1985 | Mackay | H01L 21/4853 29/843 |
| 6,175,086 B1 | | 1/2001 | Nakamura | |
| 6,281,449 B1 | | 8/2001 | Nakamura et al. | |
| 2011/0132642 A1 | | 6/2011 | Shinoda et al. | |
| 2011/0151730 A1 | | 6/2011 | Kim et al. | |
| 2012/0107648 A1 | | 5/2012 | Kim et al. | |

FOREIGN PATENT DOCUMENTS

| | | |
|---|---|---|
| EP | 0 907 308 A1 | 4/1999 |
| EP | 2 334 157 A2 | 6/2011 |
| EP | 2 339 903 A2 | 6/2011 |
| WO | WO 2011/030214 A1 | 3/2011 |

* cited by examiner

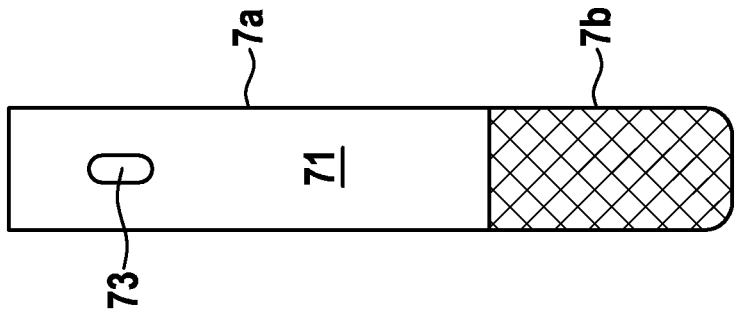
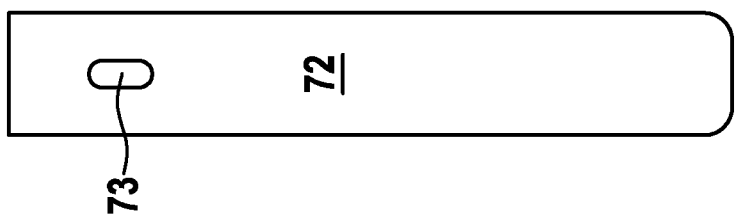
FIG. 5A  FIG. 5B
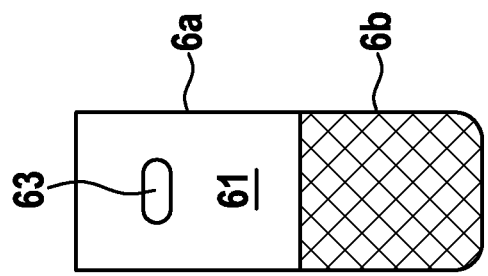
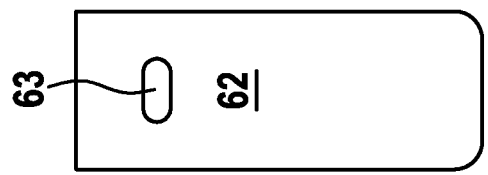
FIG. 4A  FIG. 4B

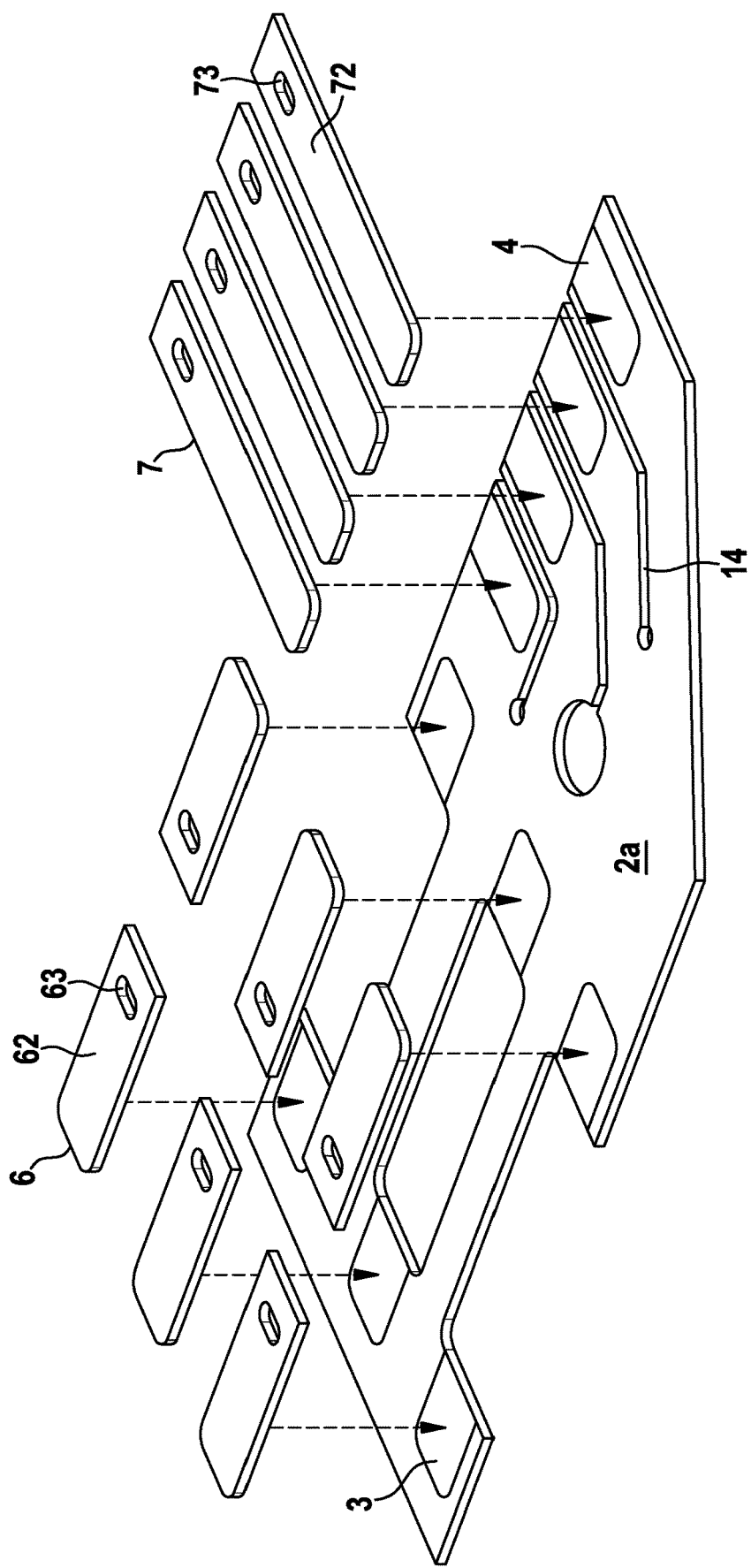

CONNECTION ELEMENT FOR AN ELECTRONIC COMPONENT ARRANGEMENT AND PROCESS TO PRODUCE THE SAME

FIELD OF THE INVENTION

The invention relates to a connection element for an electronic component assembly, in particular an electronic component assembly for an implantable defibrillator or cardiac pacemaker, and a process to produce such a connection element for an electronic component assembly. The invention also relates to an electronic component assembly, in particular an implantable defibrillator or cardiac pacemaker having such a connection element, and a process to produce such an electronic component assembly.

BACKGROUND OF THE INVENTION

In various fields of technology there is a need for increasingly smaller electronic devices. Such miniaturization requires greater integration of the circuits and their active components, and a reduction in the size of these components and their connection elements. Depending on the area of application of the electronic devices, there are also limitations with respect to the permissible techniques for manufacturing and assembling the circuit components and connection elements. This can make it difficult to use known microelectronics manufacturing processes, and may require that these processes be adapted.

Implantable electronic devices (such as implantable defibrillators or cardiac pacemakers, which have a liquid-tight biocompatible housing and an electronic component assembly arranged therein) have thus far primarily been manufactured using weldable wiring bands to connect the individual components of the component assembly. These wiring bands consist of metal conductors which are laminated on both sides with an insulation film. Design limitations result not only from the creepage distances and air clearances that must be maintained for electrical insulation, but also because reliable lamination of the films requires relatively high minimum conductor spacings, for example up to 0.6 mm.

Another disadvantage of the known wiring bands is that it is impossible to make conductor tracks cross in a wiring band. In addition, when the wiring bands bend, the laminated films create restoring forces that hinder free deformation of the bands. These restoring forces not only reduce the accuracy of fit of the deformed bands, but also lead to mechanical stresses in certain installation situations. The laminated metal conductors make the bands not very flexible, and not very suitable for evening out tolerances. All this has a detrimental effect on the long-term conductivity of electrical contacts, and can even lead to contacts tearing off of a component assembly (e.g., when subjected to vibration). This must be avoided in medical implants such as defibrillators or cardiac pacemakers.

The bands are manufactured in batches, with the bands being manually inserted one after another into various forming tools. These time- and cost-intensive processes make it difficult to meet common requirements for implantable devices, such as accuracy of fit and cleanliness. This leads to relatively high rejection rates, and therefore is economically disadvantageous.

In microelectronics, wire bonding processes are frequently used to make electrical contact between electronic components and supporting substrates (their conductor tracks or contact pads). Contact conductors are typically in the form of thin aluminum wires that are soldered or welded to the substrate and component. Holding the bond wires down and welding them onto the substrate produces strong forces, so bonding requires the use of special holders and fixation of the substrates. However, it is difficult to fix flexible substrates, especially in non-planar mounting positions. For example, they can be fixed by gluing electronic components in a housing by means of the flexible support before contact is made. In the manufacturing of implantable electronic devices the use of adhesives is detrimental, since glue fumes represent a health risk and have a negative effect on the electronic behavior of the implant.

SUMMARY OF THE INVENTION

The invention seeks to reduce the disadvantages of the prior art, and to provide a connection element for an electronic component assembly particularly suitable for use in implantable electronic devices. The connection element is ideally manufactured by means of automated processes in a cost-effective manner and with high accuracy of fit, whereby it may be kept as a semi-finished product for use for electrically conductive connection of multiple components.

In an exemplary version of the invention, a connection element for an electronic component assembly has a support with opposing first and second main support surfaces. One of the main support surfaces has a first contact pad on it, and one of the main support surfaces has a second contact pad on it. The first contact pad and the second contact pad are connected together in an electrically conductive manner through an electrically conductive structure. The connection element also has a first contact conductor with opposing first and second conductor surfaces. The first contact conductor has separate first and second sections, wherein the first section of the first conductor surface is situated adjacent the first section of the second conductor surface, and the second section of the first conductor surface is situated adjacent the second section of the second conductor surface. The first section of the first conductor surface of the first contact conductor is electrically connected to the first contact pad (preferably via a solder layer). The first contact conductor is electrically connected to the second section of the first conductor surface, and/or on the second conductor surface. The electrical connection is preferably made via welding (preferably via laser beam welding, though electron or other energy beams may be used, or via electrical resistance welding, friction welding, or ultrasound welding).

The term "opposing," when used in relation to surfaces, should be understood to mean that the surfaces have surface normal vectors which are oriented in at least substantially opposite directions, and are directed away from each other (and preferably the vectors are essentially parallel to one another). In contrast, the term "facing" means that the surface normal vectors of the surfaces have essentially opposite orientations and are pointing toward each another.

The first contact conductor is soldered to a first contact pad of the support, and at least part of the first contact conductor is configured to form a welded connection. Thus, at least part of the first contact conductor is designed to be weldable, whereby it can be welded to another component to establish electrical communication between the first contact conductor and the component over a certain service life. The connection element can then be kept in the form of a semi-finished product, and utilized in an automated soldering process wherein it is provided with a first contact conductor, and an automated welding process can be used to establish an electrically conductive connection with a component. Further components can be connected to the connection element in the same way or in another way, for example through soldered connections or plug-and-socket connections.

The first contact conductor, in particular its second conductor surface and/or the second section of its first conductor surface, is preferably configured to be suitable for laser beam welding and/or for resistance welding. Preferred configurations, dimensions, and materials for the first contact conductor are explained in detail below.

In a preferred version, the first section of the first contact conductor is situated adjacent the first contact pad with the first conductor surface facing the first contact pad. One or more additional layers can be situated between the contact pad and the first section of the first contact conductor. This arrangement makes it simple to form a solder layer between the contact pad and the first section to make an electrically conductive connection therebetween. In this version of the invention, the second section of the first conductor surface of the first contact conductor is not situated adjacent the first contact pad, for example, it projects over the side of the first contact pad. Additionally or alternatively, the second section of the first conductor surface of the first contact conductor does not face the first contact pad, for example, the second section is oriented at an angle to the first contact pad. Preferably, the second section of the first conductor surface of the first contact conductor is not situated adjacent a main support surface, for example, the second section projects over a side edge of the support, or over the edge of an opening in the support. It is also preferred for the second section of the first conductor surface of the first contact conductor not to face a main support surface, for example, that it be oriented at a right angle to the first section or the support. In both cases, the second section of the first conductor surface of the first contact conductor is not soldered or otherwise connected to the first contact pad. However, the first contact conductor has improved weldability, in particular improved welding capability at the second section of its first conductor surface.

The connection element also preferably has a second contact conductor with opposing first and second conductor surfaces. A first section of the first conductor surface of the second contact conductor has an electrically conductive connection with the second contact pad (preferably via a soldered layer). The second contact conductor is configured to accommodate a welded connection in a second section of the first conductor surface, and/or on the second conductor surface. Thus, the connection element can be kept in the form of a semi-finished product; connected with a first and a second contact conductor in an automated soldering process; and electrically connected with two components in an automated welding process.

The first section of the first conductor surface of the second contact conductor is preferably situated adjacent the second contact pad, with the first section facing the second contact pad. One or more layers can be situated between the second contact pad and the first section of the first conductor surface of the second contact conductor. This arrangement makes it simple to form an electrically conductive connection between the second contact pad and the second contact conductor, e.g., via soldering. The second section of the first conductor surface of the second contact conductor is preferably not situated adjacent the second contact pad, for example, it may project over the side of the second contact pad. Additionally or alternatively, the second section of the first conductor surface of the second contact conductor does not face the second contact pad, for example, the second section may be oriented at an angle to the first section or to the second contact pad. Preferably, the second section of the first conductor surface of the second contact conductor is not situated adjacent a main support surface, for example, the second section projects over a side edge of the support, or over the edge of an opening in the support. It is also preferred for the second section of the first conductor surface of the second contact conductor not to face a main support surface, for example that it be oriented at a right angle to the first section or the support. In both cases, the second section of the first conductor surface of the second contact conductor is not soldered or otherwise connected to the second contact pad. However, the second contact conductor has improved weldability, in particular improved welding capability at the second section of its first conductor surface.

The connection element may have multiple (i.e., at least two) first contact pads and multiple second contact pads, with the number of first and second contact pads depending on the number of components that are intended to make contact by means of the connection element, and on the number of contact points of these components. The connection element may also have multiple electrically conductive structures for making an electrically conductive connection between the first and second contact pads, with each electrically conductive structure making an electrically conductive connection between at least one first contact pad and at least one second contact pad. The connection element may also have multiple first contact conductors and multiple second contact conductors in the form described above, each making an electrically conductive connection with a first or a second contact pad (e.g., by means of a solder layer). This arrangement allows the use of a connection element to connect one or more electronic components with one another and/or with a source of electrical current or voltage.

The first and/or second contact conductor are preferably made of nickel, copper, tantalum, niobium, aluminum, or alloys of these materials. Alternatively or additionally, the first and/or second contact conductor has, on a second section of its first conductor surface and/or on its second conductor surface, a coating made of nickel, copper, tantalum, niobium, aluminum, or alloys of these materials. These materials help provide a welded connection that has long-term stability, thereby increasing the welding suitability of the contact conductors. Preferably, the first and/or second contact conductor is made of nickel, or is coated with nickel.

The first and/or second contact conductor of the connection element is preferably in the form of a flat metal strip, a metal foil, or a metal cuboid. A contact conductor in the form of a metal strip or a metal foil has a height that is small in relation to the length and width of the contact conductor, preferably less than a tenth of it, especially preferably less than a twentieth of it. A contact conductor in the form of a metal cuboid has a height on the same order of magnitude as the length and width of the cuboid, making it possible, for example, to implement plug-and-socket connections. It is especially preferred for the first and/or second contact conductor to be in the form of a nickel strip or nickel foil, for example, with a thickness of 0.1 mm. A contact conductor in the form of a metal strip or a metal cuboid has high welding suitability and welding security, and is also dimensionally stable.

The second section of the first contact conductor, and/or of the second contact conductor, may have a passage between its first conductor surface and its second conductor surface. The position of the passage can vary, and it may be of any suitable shape, e.g., circular, oval, or in the form of an elongated hole. The passage can be used as a position mark in an automated welding process. The shape and cross-sectional area of the passage is preferably suitable to carry out a laser beam welding process through the passage, that is, to allow the laser beam used for welding to pass through the contact conductor, thereby providing improved welding capability in the second section. The shape of the passage is preferably suitable to allow an optical test procedure to be performed through the passage, in particular to optically check the contact conductor's welded connection situated over the passage (with automated optical inspection being preferred).

Alternatively, or in addition to the passage, a contact conductor in the form of a metal cuboid or a metal strip can have a blind hole to hold a contact pin of a component, to allow a plug-and-socket connection with the contact conductor.

When the connection element is used in a component assembly of an implantable electronic device, for example in an implantable cardiac pacemaker or defibrillator, the first or second contact conductor also has a current-carrying cross section that is suitable to conduct current pulses of up to 10 A, preferably up to 15 A, and especially preferably up to 20 A. In other words, the contact conductor can repeatedly carry such a current pulse without its electrical conductivity being impaired. It is also preferred if the first or second contact conductor is designed to carry electrical currents with an energy of up to 30 joules, preferably up to 40 joules, and especially preferably up to 50 joules. It is also preferred that any solder connections between a contact conductor and contact pad, and any welded connections between a contact conductor and component, be designed to carry electrical currents of this strength or energy.

The support may be in the form of a flexible circuit support, in particular in the form of a printed circuit board (PCB). Flexible circuit supports are made from a flexible plastic substrate that serves as a support material, and include electrically conductive metal structures. Such a flexible circuit support may be made using thin film technology or flex circuit technology. The flexible plastic substrates are preferably polyimide films, polyester films, polyetheretherketone films (PEEK), or liquid crystal polymers (LCP). The electrically conductive metal structures are preferably made of aluminum, copper, or alloys of these materials. A preferred arrangement provides the electrically conductive structure in the form of an electrically conductive metal structure situated between the first and second main support surfaces. It is especially preferred for each of the first and the second main support surfaces to be formed of a thin layer of a dielectric plastic. Contact pads may make contact with the electrically conductive metal structure through one or both of the dielectric thin layers. A flexible circuit support can advantageously implement mounting positions which are folded or curved one or more times, allowing the support to make optimal use of limited space, for example, within the housing of a medical implant. A flexible circuit support is also useful in applications that require high flexibility of the interconnect subassembly, for example, to even out tolerances, and/or if there is mechanical stress on the subassembly.

Flexible circuit supports are preferably configured so that conductor track structures made of copper, gold, platinum, niobium, etc. are located between LCP (liquid crystal polymer) film layers. A substrate with LCP film layers is preferred because the small layer thickness of the insulation material can provide higher flexibility. Such a support also exhibits water-absorbing properties, such that when used in implantable defibrillators or cardiac pacemakers, less moisture remains in the implant and corrosion processes are prevented. The material's thermal dissipation is also advantageous. A support having two polyimide layers with an internal conductive copper layer can serve as an insulator. A multilayer support is also possible, e.g., in order to avoid crossing conductor tracks. It is important that the conductor tracks have good electrical conductivity (low total resistance), and the electrical resistance of conductive polymers (plastics mixed with silver or other conductive particles) can be an order of magnitude higher than, e.g., copper. In an implantable cardiac defibrillator (ICD), very high currents flow on these connector conductor tracks for short periods of time. Conductor tracks with high resistance could lead to high losses in the conductor tracks, making it impossible to carry out effective defibrillation therapy.

It is also preferred for the flexible circuit support to be configured to even out tolerances of ±3 mm, preferably ±2 mm, and especially preferably ±1 mm by a geometric offset in the surface. Thus, for example, a component's contact points which are offset to one another in height can make contact by means of a single connection element having a single planar circuit support. Such a flexible circuit support remains functional in its mounting position, even in the case of perturbations, for example vibrations. The conductivity of the electrically conductive structures and contact pads is preferably maintained when there is perturbation. It is especially preferred for the flexible circuit support to have slots to increase its flexibility, with the slots extending from one edge of the support and extending from its first main support surface to its second main support surface.

In a preferred version of the invention, the first or second contact conductor has a shape adapted to the mounting position of the support, in particular a flexible support, in an implantable electronic component assembly. In other words, the first or second contact conductor has a shape that makes it possible, even in the case of component assemblies with complex geometries (e.g., non-planar or folded geometries), for components to be electrically connected by means of the connection element. Component assemblies with complex geometries may be used where limited space is available, for example in the case of medical implants. The complex geometry of the component assembly is frequently accompanied by a complex non-planar geometry of the support. Adaptation of the contact conductor to the mounting position of the support allows easier use of automated welding process to make electrical contact between components without placing mechanical stresses on the welding points when the support is put into its mounting position. Thus, adaptation of the shape of the contact conductors to the mounting position of the support improves the ease of welding, and the weld strength, of the contact conductors. Once deformed, contact conductors are, without external influences, dimensionally stable below a certain minimum deformation force, which is selected to avoid unwanted deformations.

In a preferred version of the invention, the first and second sections of the first conductor surface of the first contact conductor are angled with respect to each other, in particular at an angle not equal to 180°, that is, an acute, obtuse, or right angle. The first and second sections of the first conductor surface of the second contact conductor may similarly be angled. These arrangements can ease welding at the second section of the first and/or second contact conductor. The use of curved or bent contact conductors additionally allows adaptation of the contact conductors to the mounting position of the support, and the use of the connection element in a component assembly having complex geometry.

The first conductor surface of the first contact conductor, and/or of the second contact conductor, preferably has a coating in its first section to improve its wettability with a solder material. These coatings make it easier to form a solder layer between the first or second contact conductor and the first or second contact pad. Various coatings to improve the wettability of a metal surface with a solder material are known from microelectronics. The suitability of a coating can vary depending on the respective materials of a contact conductor or a contact pad. The coating preferably includes at least one of the following: lead-free hot air leveling (HAL), a chemically deposited nickel-gold layer (ENIG), a chemically deposited silver layer (ImAG), lead tinning, a galvanically applied nickel-gold layer (galvanic NiAu), and/or a coating with conductive carbon. It is especially preferred that the first conductor surface of the first section of the first or second contact conductor has an ENIG coating.

In addition to the connection element described above, the invention also encompasses an electronic component assembly wherein the connection element connects to one or more electronic components. The electronic component has a contact point welded to the second section of the first or second conductor surface of the first contact conductor. The connection element preferably has multiple first contact pads and multiple first contact conductors soldered thereon, with the electronic component having multiple contact points welded with the first contact conductors. The electronic component may be an implantable defibrillator or an implantable cardiac pacemaker, or a component thereof. The connection element of the electronic component assembly also preferably includes one or more second contact conductors as described above, with a current or voltage source having a contact pin soldered or otherwise connected to the second section of the first conductor surface of the second contact conductor, or to the second conductor surface of the second contact conductor.

In the electronic component assembly, the connection element may have a second contact conductor with a blind hole configured to receive a contact pin of the current or voltage source. The blind hole is preferably situated in the second section of the first conductor surface of the second contact conductor, or in the second conductor surface of the second contact conductor (and may be provided in addition to, or as an alternative to, a through hole situated there). The blind hole can be used to make a plug-and-socket connection between the second contact conductor and the contact pin of the current or voltage source, instead of or in addition to the welded connection. The second contact conductor is preferably configured a metal (particularly nickel) cuboid.

In the electronic component assembly, the connection element may also have multiple third contact pads situated on the support, with each of the third contact pads being electrically connected to another through at least one electrically conductive structure. The connection element may also have multiple third contact conductors situated on its support, with these contact conductors having a first conductor surface and an opposing second conductor surface, with each first conductor surface having an electrically conductive connection with a third contact pad (e.g., via a solder layer at a first section).

In addition to the connection element described above, and to electronic component assemblies including such connection elements, the invention also involves a process for producing such a connection element. Such a process may include the steps of providing a support as described above; providing a first contact conductor as described above; situating the first contact conductor adjacent the support with a first section of the first contact conductor adjacent the first contact pad; and soldering the first section of the first conductor surface of the first contact conductor to the first contact pad to make an electrically conductive connection therebetween. The process thus produces a weldable connection element for an electronic component assembly by soldering contact conductors having weldable sections to the contact pads of a circuit support, preferably a flexible circuit support as described above. Commercially available flexible substrates may be used, such as (for example) FK4, flex substrate, LCP, PEEK, and thin-film technology. The support is preferably processed using an automated surface mount technology (SMT) process, and the contact conductors are preferably soldered in an automated reflow soldering process. Thus, the connection element can be produced in a completely automated process. The weldable contact conductors of the (flexible) circuit support are situated to conform to the later mounting position of the circuit support.

In a preferred implementation of the process for producing the connection element, the first section of the first contact conductor is preferably situated adjacent the first contact pad of the support with the first conductor surface of the first contact conductor facing the first contact pad. Either before or after the first contact conductor is soldered or otherwise attached to the first contact pad, the first contact conductor is reshaped (e.g., bent). This is preferably done so that the second section of the first conductor surface of the first contact s conductor does not face the first contact pad and/or a main support surface, as by orienting the second section at a right angle to the first section of the first conductor surface (and/or with the support). The contact conductors may be reshaped by means other than bending, for example, by punching.

Additionally, when situating the first section of the first contact conductor as described above, the second section of the first conductor surface of the first contact conductor preferably is not situated adjacent a main support surface, for example, the second section projects over a side edge of the support, or over the edge of an opening in the support. This process produces a connection element with enhanced welding capability.

When producing the connection element, it is preferable to have each contact conductor formed of nickel, copper, tantalum, niobium, aluminum, or alloys thereof, and to have the first section of the first conductor surface coated to improve its solder wettability. Solder may then be applied onto the coated first section to form a solder layer. The second section of the first conductor surface, and/or the second conductor surface, if not already formed of the foregoing materials, may be coated with nickel, copper, tantalum, niobium, aluminum, or alloys thereof. It is especially preferred if the first section of the first conductor surface of the contact conductor is given an ENIG layer or an ImAg layer in an autocatalytic process (ENIG being particularly preferred); a HAL coating by immersion of the first contact conductor; a NiAu layer by galvanic deposition; or a coating with conductive carbon.

The invention also involves a process of producing an electronic component assembly by producing a connection element as described above; providing an electronic component with a contact point configured to form a welded connection; and welding the second section of the first conductor surface of the first contact conductor, or the second conductor surface of the first contact conductor, to the contact point of the electronic component.

The process for producing an electronic component assembly also preferably includes providing the connection element with a second contact conductor as described above; providing a current or voltage source with a contact pin configured to form a welded connection, a soldered connection, or a plug-and-socket connection; and electrically connecting the second section of the first conductor surface of the second contact conductor, or the second conductor surface of the second contact conductor, to the contact pin of the current or voltage source. The contact pin of the current or voltage source is preferably designed to form a welded connection, and the second section of the first conductor surface of the second contact conductor (or the second conductor surface of the second contact conductor) is welded to the contact pin of the current or voltage source, preferably by laser beam welding.

The process may use any of the other features discussed above, for example, the connection element may have multiple third contact pads with multiple third contact conductors connected thereto; the contact conductor(s) may be reshaped as described above (e.g., they may be bent or curved); the second section(s) of the contact conductor(s) may be situated away from (off of) a main support surface (e.g., they may project over a side edge of the support, or over the edge of an opening in the support); one or more of the contact conductors may have a passage defined in its second section to ease laser welding of the second section to the contact point of the electronic component; and the contact conductor(s) may be made of the aforementioned materials, and/or may be coated to improve solder wettability.

BRIEF DESCRIPTION OF THE DRAWINGS

The invention is explained below in relation to exemplary versions depicted in the Figures, which include:

FIGS. 4A and 4B: front and back views of a first contact conductor of a connection element for an electronic component assembly;

FIGS. 5A and 5B: front and back views of a second contact conductor of a connection element for an electronic component assembly;

FIGS. 6A-6C: a schematic representation of a process to produce a connection element for an electronic component assembly;

DETAILED DESCRIPTION OF EXEMPLARY VERSIONS OF THE INVENTION

Figure 1:
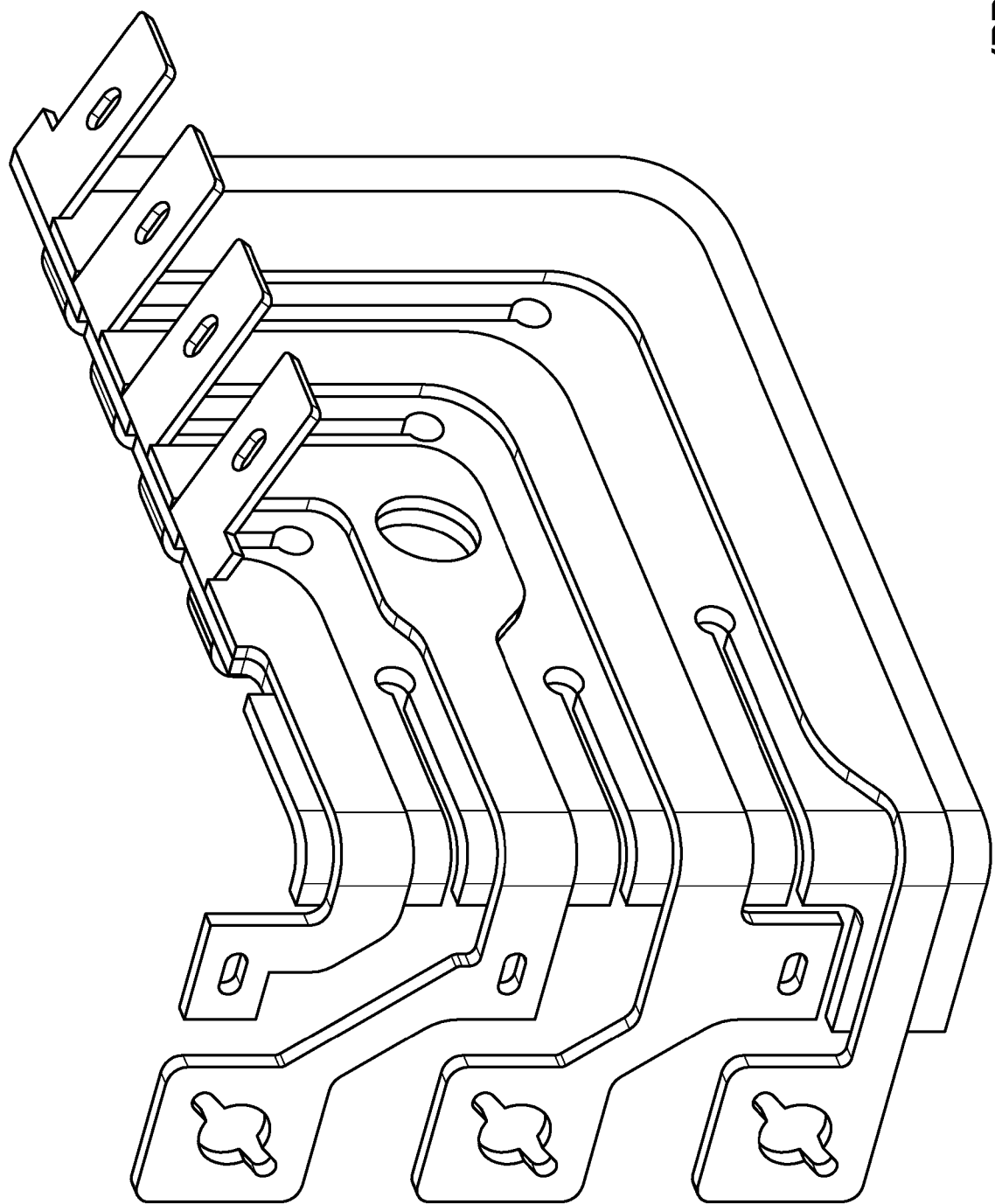
FIG. 1: A perspective representation of an exemplary prior art wiring band.

FIG. 1 shows an exemplary known wiring band used for electrically conductive connection of the components of an implantable electronic component assembly, for example, a cardiac pacemaker or defibrillator. The illustrated wiring band consists of etched metal conductors that are laminated on both sides with a polyimide insulation film. The metal conductors must have minimum spacings of 0.6 mm between them in order for the insulation films to laminate well with one another. No crossing conductor tracks can be realized within a wiring band. Before the components are connected, the wiring bands are curved in shape. The laminated polyimide film produces restoring forces that cause the metal conductors to "spring back." This reduces the geometric exactness of the wiring band and leads to inaccuracies of fit.

Figure 2:
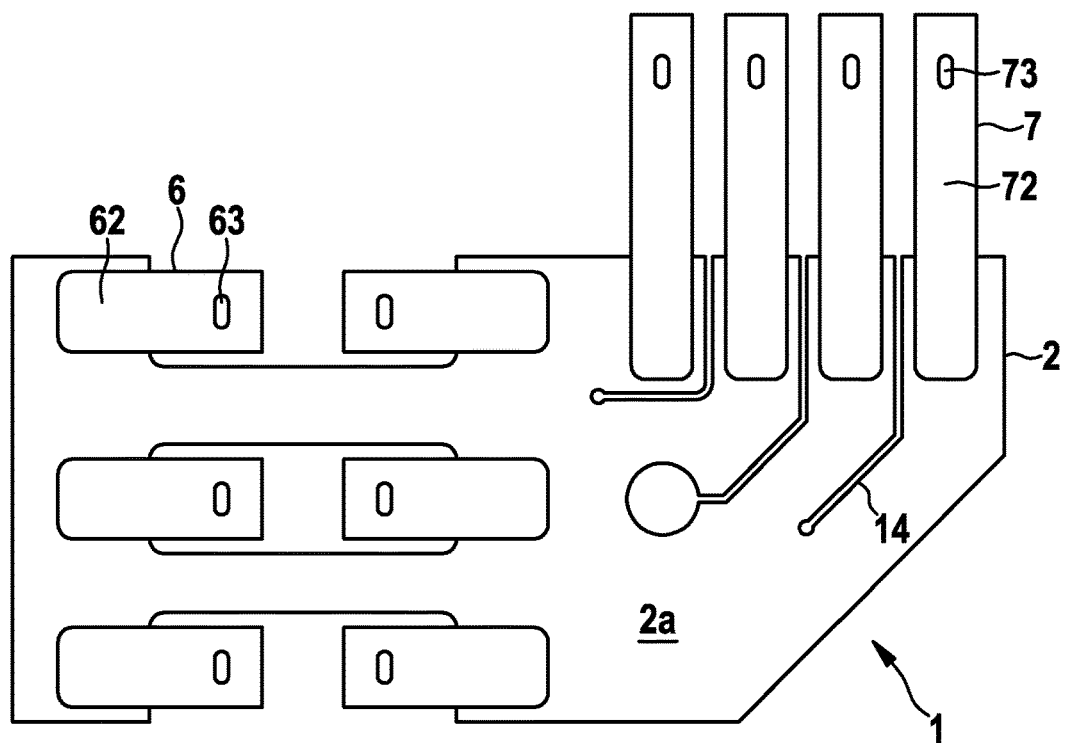
FIG. 2: A top view of a connection element for an electronic component assembly.
Figure 3:
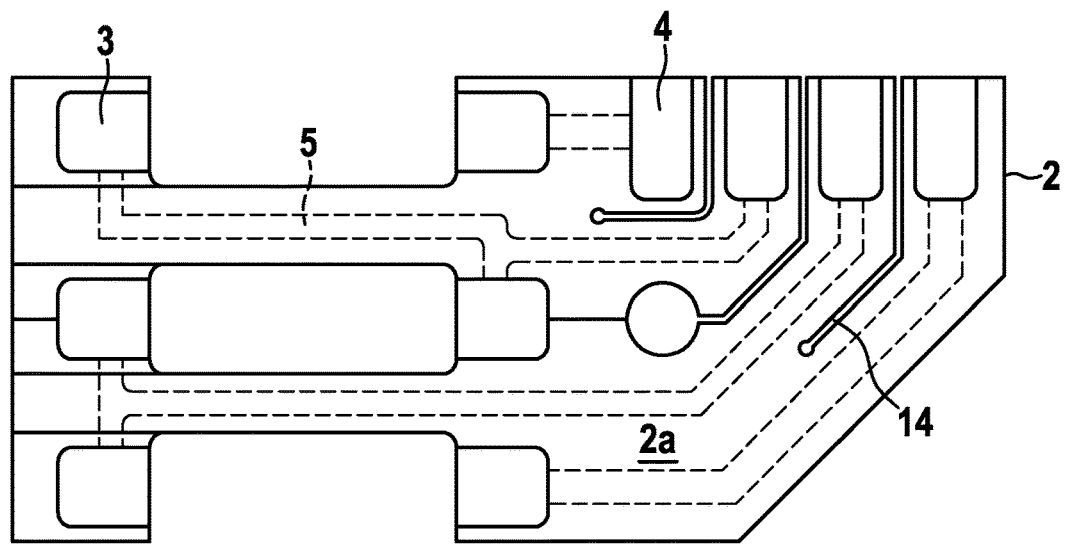
FIG. 3: a detailed top view of a support of a connection element for an electronic component assembly.

FIG. 2 shows a top view of a connection element 1 for an exemplary electronic component assembly in accordance with the invention. The connection element has a support 2 made of flex substrate. A detailed top view of these supports is shown in FIG. 3. Support 2 has a first flexible dielectric main support surface 2a and an opposite flexible dielectric main support surface 2b (not visible in FIGS. 2-3), between which a flexible structured copper metallization with a thickness between 20 μm and 50 μm forms electrically conductive structures 5. The first main support surface 2a of support 2 has six first contact pads 3 (FIG. 3) thereon. The first contact pads 3 preferably consist of gold-coated metallizations that penetrate the first main support surface 2a of the support 2 and electrically contact the copper metallizations 5 through feedthroughs (often referred to as vias). Four of the first contact pads 3 are arranged on an outer edge of the support 2, and two of the first contact pads 3 are arranged on the edge of an opening in the support 2. As shown in FIG. 2, six first contact conductors 6 are soldered or otherwise conductively connected with the first contact pads 3 so that a part of the first contact conductor 6 projects over the edge of the support 2.

A front and back view of a first contact conductor 6 are shown in FIGS. 4A-4B. FIG. 4A shows the back as second conductor surface 62 of the first contact conductor 6, and FIG. 4B shows the front as first conductor surface 61 of the first contact conductor 6. The first contact conductor 6 is preferably made of nickel strip made of 99% pure nickel (ASTM B-162), and has a thickness of about 0.1 mm. The width of the first contact conductor 6 is about 1.2 mm and essentially corresponds to the width of the first contact pad 3. The length of a first contact conductor is about 3.4 mm and is selected so that a first contact conductor 6 soldered to a first contact pad 3 projects over an edge of the support 2. In a first section 6a of the first conductor surface 61 of the first contact conductor 6, an ENIG coating 8 is applied to improve the wettability with a solder material. A second section 6b of the first contact conductor 6 has a passage 63 arranged in it that connects the front 61 of the first contact conductor 6 with its back 62.

As shown in FIG. 3, four of the second contact pads 4 are arranged on an outer edge of the first main support surface 2a of the support 2. The second contact pads 4 also preferably consist of gold-coated metallizations that penetrate the first main support surface 2a of the support 2 and electrically contact the copper metallizations 5. The second contact pads 4 are connected in an electrically conductive manner with first contact pads 3, preferably through copper metallizations 5. As shown in FIG. 2, four second contact conductors 7 are soldered or otherwise conductively connected with the four second contact pads 4, and partly project over the edge of the support 2.

Front and back views of a second contact conductor 7 are shown in FIGS. 5A-5B. FIG. 5A shows the back as second conductor surface 72 of the second contact conductor 7, and FIG. 5B shows the front as first conductor surface 71 of the second contact conductor 7. The second contact conductor 7 is preferably made of nickel strip made of 99% pure nickel (ASTM B-162), and has a thickness of about 0.1 mm. The width of the second contact conductor 7 is about 0.9 mm and essentially corresponds to the width of the second contact pad 4. The length of the second contact conductor 7 is about 6.2 mm and is selected in such a way that a second contact conductor 7 soldered to a second contact pad 4 projects over an edge of the support 2. In a first section 7a of the first conductor surface 71 of the second contact conductor 7, an electroless nickel immersion gold (ENIG) coating 8 is applied to improve the wettability with a solder material. A second section 7b of the second contact conductor 7 has a passage 73 defined in the form of elongated hole 73 with a length of about 0.5 mm, and that connects the front 71 of the second contact conductor 7 with its back 72.

The support 2 shown in FIG. 3 also has slots 14 that extend from one edge of the support 2 and extend from the first main support surface 2a to the opposite main support surface 2b. The slots 14, which preferably have a width of about 0.1 mm, may be produced by laser cutting of the support 2. Each of the slots 14 is arranged between the second contact pads 4 so that the flexible support 2 has increased flexibility in the area of these contact pads 4. The slots 14 allow an offset of ±1 mm in area, and thus allow the connection element 1 to even out tolerances. For example, the second contact pads 4 can make secure contact with contact pins of a current or voltage source to be connected, wherein these contact pins are offset with respect to one another in height.

Figure 6B:
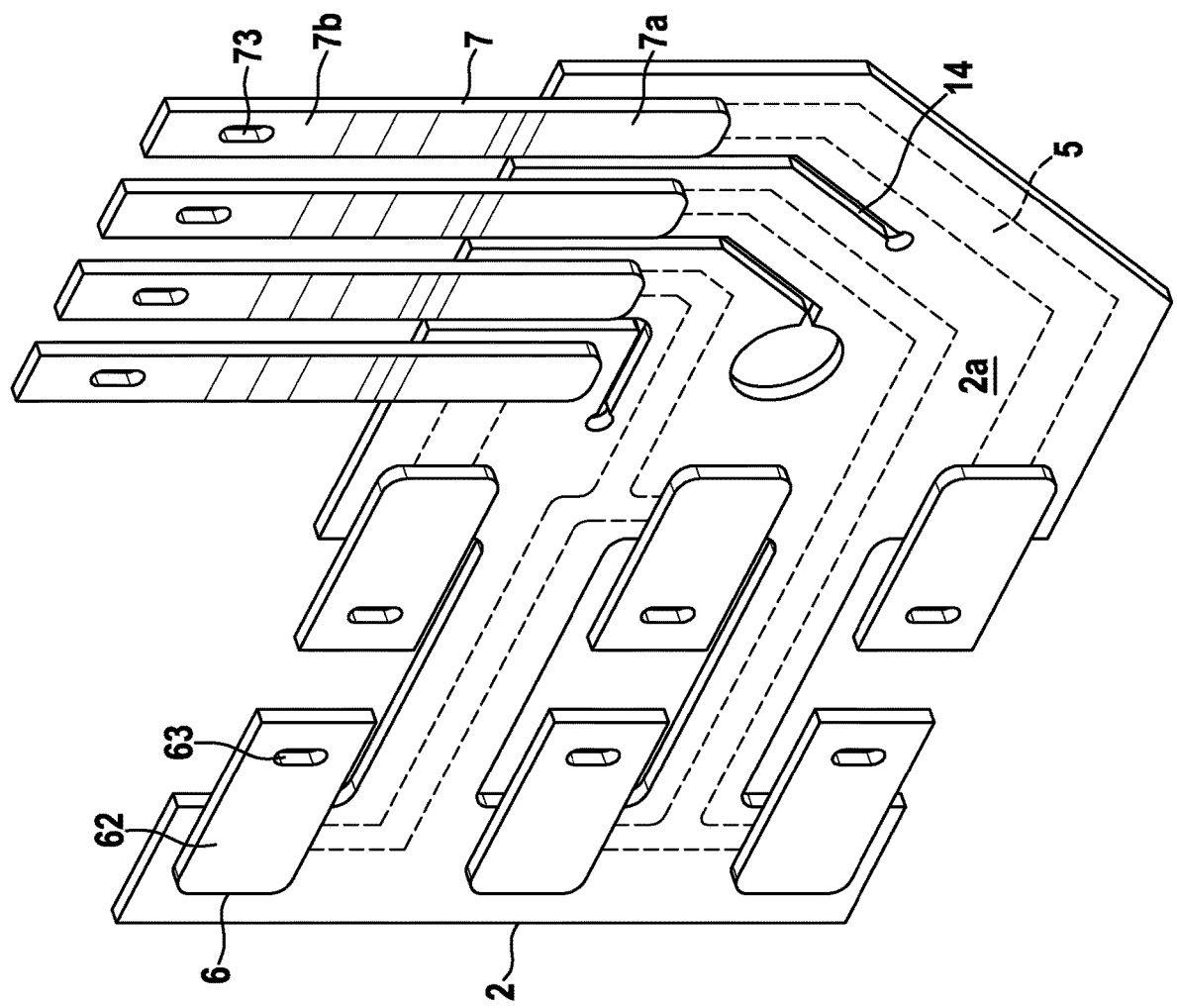

A schematic representation of a process to produce a connection element 1 for an electronic component assembly is shown in FIGS. 6A-6B. FIG. 6A shows the first partial steps of the process, in which first a support 2 is provided, as shown in FIG. 2. The support 2 is then equipped with six first contact conductors 6, as shown in FIG. 3. These are arranged over the support 2 in such a way that each ENIG-coated first section 6a of the first conductor surface 61 of the first contact conductor 6 is situated over a first contact pad 3. The first contact conductors 6 then undergo an automated reflow soldering process to form a solder layer 11 that physically and electrically connects them with the first contact pads 3.

The support 2 is then equipped, in an automated process, with four second contact conductors 7, as shown in FIGS. 4A-4B. These are arranged over the support 2 in such a way that each ENIG-coated first section 7a of the first conductor surface 71 of the second contact conductor 7 is situated over a second contact pad 4. Then, the second contact conductors 7 undergo an automated reflow soldering process to form a solder layer 11 that physically and electrically connects them with the second contact pads 4.

The resulting connection element 1, as shown in FIG. 6B, has the first contact conductors 6 soldered to the support 2 in such a way that each second section 6b of the first contact conductors 6 projects over an edge of the support 2, with each having a through hole 63. Thus, the second section 6b of the first contact conductor 6 is not arranged over the support 2. In addition, the second contact conductors 7 are soldered to the support 2 in such a way that each second section 7b of the second contact conductors 7 projects over an edge of the support 2, with each having a through hole 73. Thus, the second section 7b of the first contact conductor 7 is not arranged over the support 2.

Figure 6C:
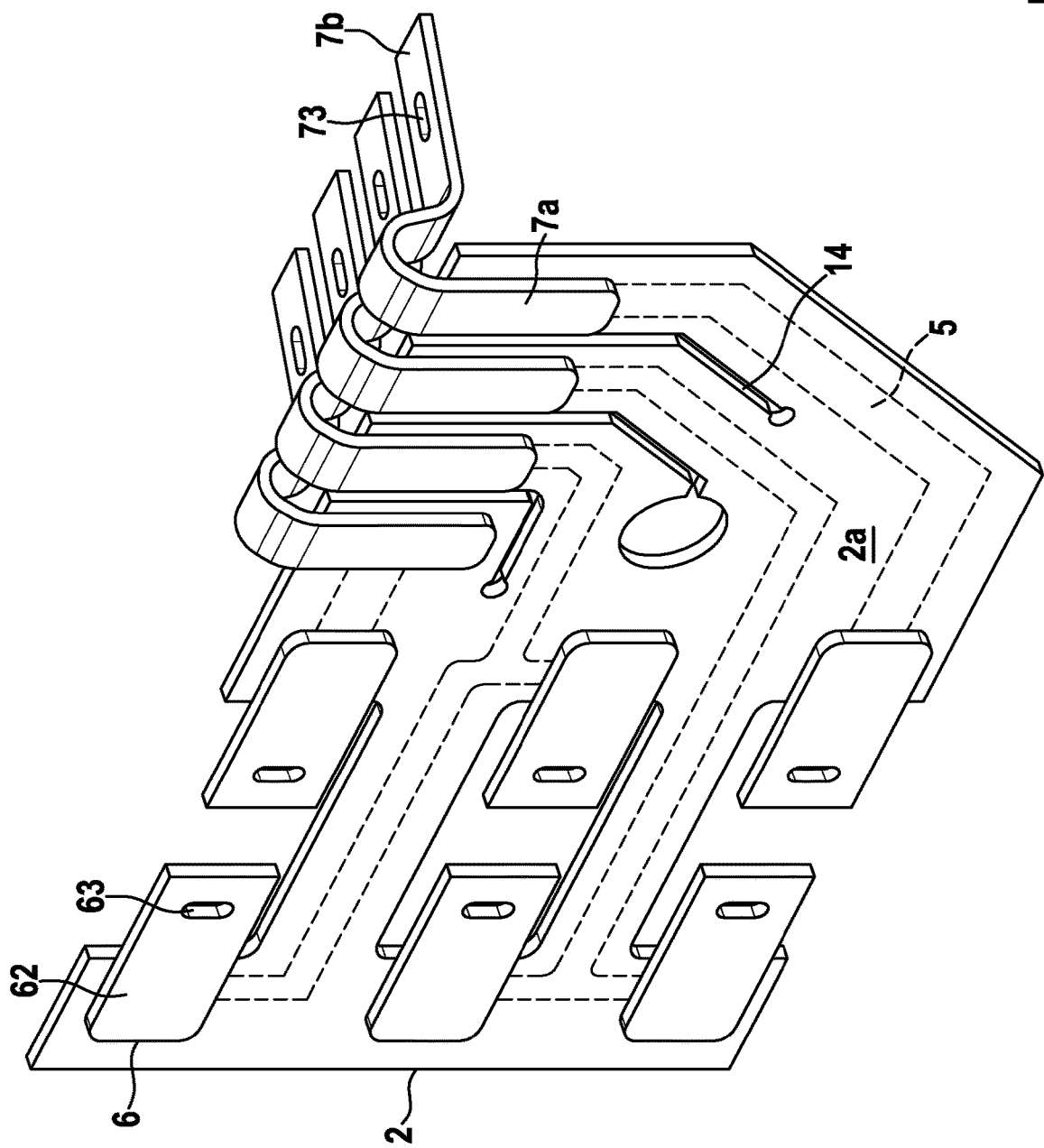

In a following process step, the second contact conductors 7 are reshaped in such a way that the second sections 7b of the second contact conductors 7, which project over the outer edge of the support 2, are curved. This produces a connection element 1 as shown in FIG. 6C. The second sections 7b of the second contact conductors 7 define an approximately right angle with respect to the first sections 7a of the second contact conductors 7.

Figure 7A:
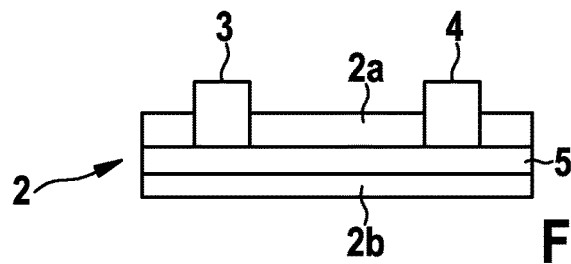
FIGS. 7A-7E: a schematic representation of a process to produce an electronic component assembly.

FIGS. 7A-7E schematically depict a process to produce an electronic component assembly with a connection element 1 as described above. FIG. 7A shows a support 2 with a first main support surface 2a, an opposite second main support surface 2b, and a copper metallization 5 arranged between the dielectric main support surfaces 2a, 2b. The first main support surface 2a has a first contact pad 3 and a second contact pad 4 that penetrate the dielectric main support surface 2a and make electrical contact with the copper metallization 5.

Figure 7B:
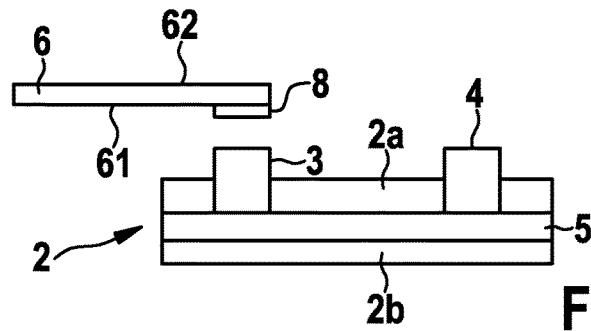
Figure 7C:
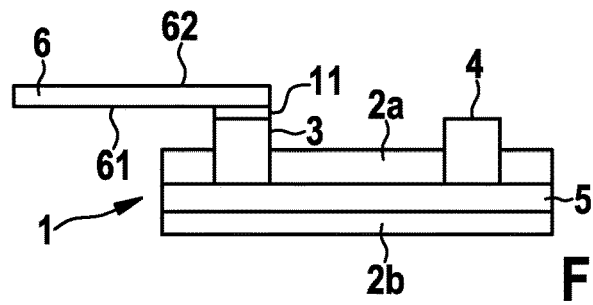
Figure 7D:
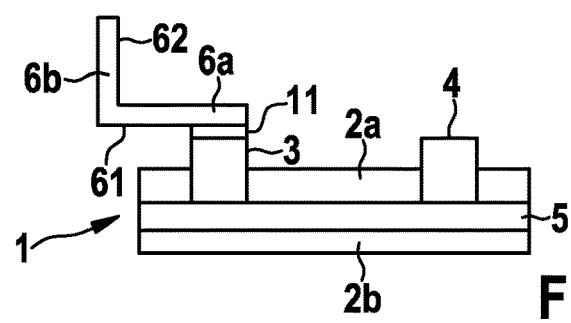

FIG. 7B shows how a first contact conductor 6, as shown in FIG. 3, is situated over the support 2 in such a way that a first section 6a of the first conductor surface 61, which bears an ENIG coating 8, is situated over the first contact pad 3. The first conductor surface 61 of the first contact conductor 6 faces the first contact pad 3. FIG. 7C depicts connection of the first contact conductor 6 with the first contact pad 3 in an electrically conductive manner through a solder layer 11 by means of an automated process, e.g., reflow soldering. Then, the second section 6b of the first contact conductor 6 is bent or otherwise reshaped so that it includes a right angle with the first section 6a of the first contact conductor 6, as shown in FIG. 7D.

Figure 7E:
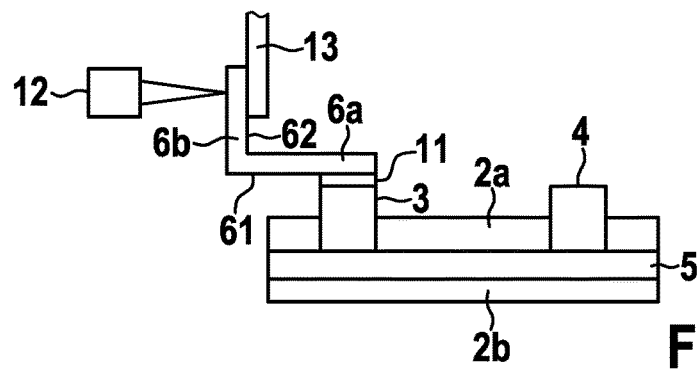

FIG. 7E shows how the first contact conductor 6 is electrically connected (e.g., in a laser welding process) with a contact point 13 of an electronic component (not shown). To accomplish this, the contact point 13 is put against the second conductor surface 62 of the second section 6b of the first contact conductor 6. The beam of a welding laser 12 is then directed onto the second section 6b of the first contact conductor 6, and also onto the contact point 13 of the component through the passage 63. This melts the surface of the first contact conductor 6 in the second section 6b and makes a welded connection with the contact point 13, whose surface is also melted.

Figure 8:
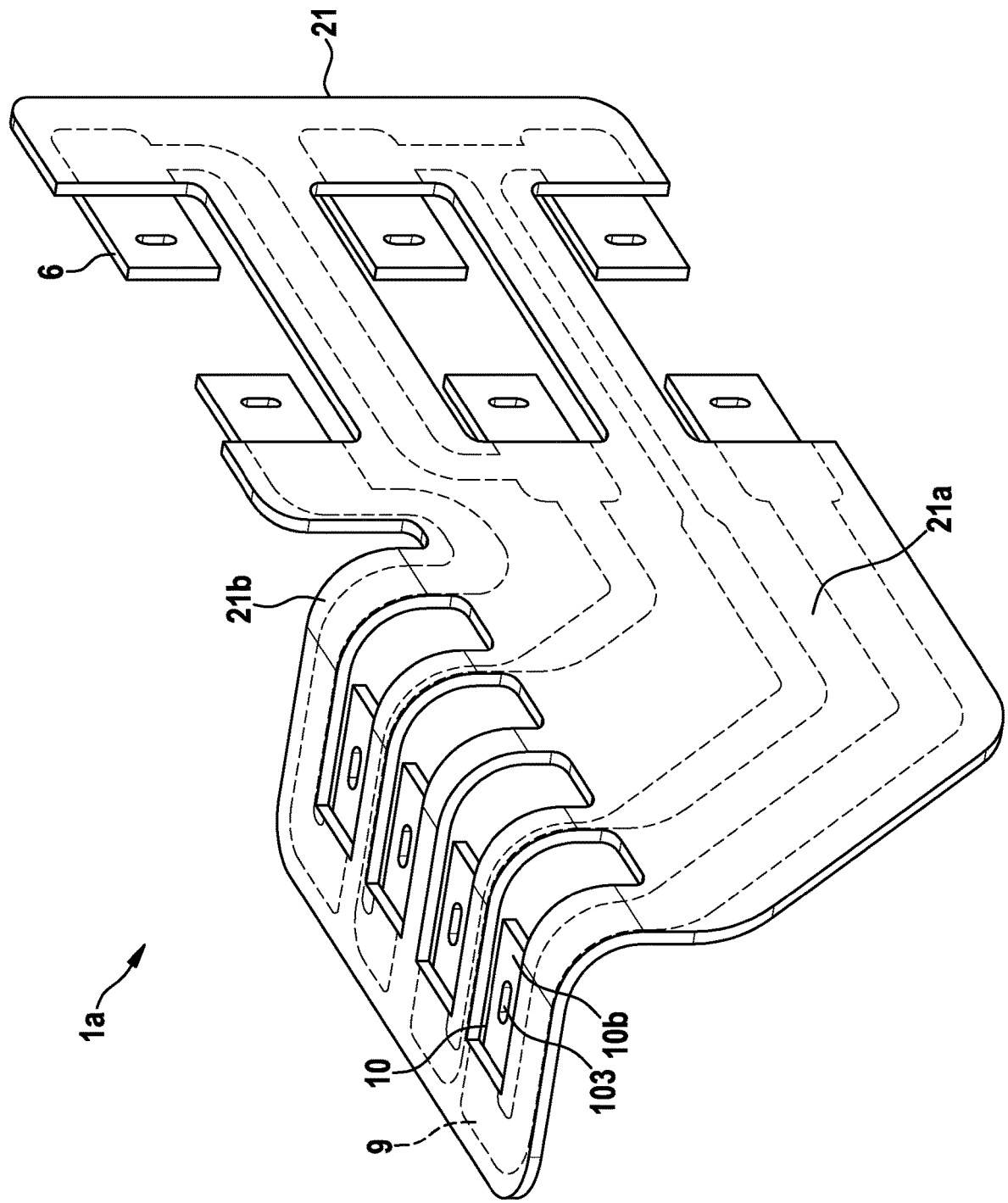
FIG. 8: a back view of another version of the connection element for an electronic component assembly.

FIG. 8 shows the back view of another version of the connection element 1a for an electronic component assembly. Connection element 1a has a support 21 made of flex substrate, and a first contact conductor 6 connected to the support 21, as described above. Furthermore, connection element 1a has a third contact conductor 10 that has, like the second contact conductor 7, a first and second conductor surface (not shown in FIG. 8), a first section (not shown in FIG. 8), a second section 10b, and a passage 103. Support 21 also includes a third contact pad 9 (located on the back of support 21 in FIG. 8), to which the third contact conductor 10 is soldered. In the connection element 1a, the third contact conductor 10 need not be bent at an angle with respect to the section 21a of the support 21 and with respect to the contact conductor 6, since the intermediate section 21b is defined by a flexible part of the support. The bending could be carried out during assembly of the connection element 1a, so that no bending tool would be required for connection element 10.

Exemplary versions of the invention have been described above, and the invention is not intended to be limited to these versions, but rather is intended to be limited only by the claims set out below. Thus, the invention encompasses all different versions that fall literally or equivalently within the scope of these claims.

What is claimed is:

1. A connection element for an electronic component assembly, the connection element including:

a. a flexible circuit support having:
  (1) a first main support surface,
  (2) a second main support surface opposite the first main support surface,
  (3) a first contact pad situated on one of the main support surfaces,
  (4) a second contact pad situated on one of the main support surfaces, and
  (5) an electrically conductive structure electrically connecting the first contact pad and the second contact pad;
b. a first contact conductor:
  (1) having:
    (a) a first conductor surface, wherein a first section of the first conductor surface is electrically connected to the first contact pad, and
    (b) a second conductor surface opposite the first conductor surface,
  (2) wherein the first contact conductor is configured to form a welded connection:
    (a) on a second section of the first conductor surface, and/or
    (b) on the second conductor surface.

2. The connection element of claim 1 wherein the first section of the first conductor surface is electrically connected to the first contact pad by a solder layer.

3. The connection element of claim 1 wherein:
a. the first section of the first contact conductor is situated over the first contact pad,
b. in the first section, the first conductor surface of the first contact conductor faces the first contact pad, and
c. the second section of the first conductor surface of the first contact conductor:
  (1) is not situated over the first contact pad, and/or
  (2) does not face the first contact pad.

4. The connection element of claim 1, further including a second contact conductor:
a. having:
  (1) a first conductor surface, wherein a first section of the first conductor surface of the second contact conductor is electrically connected to the second contact pad, and
  (2) a second conductor surface opposite its first conductor surface,
b. wherein the second contact conductor is configured to form a welded connection
  (1) on a second section of its first conductor surface, and/or
  (2) on its second conductor surface.

5. The connection element of claim 4 wherein the first section of the first conductor surface of the second contact conductor is electrically connected to the second contact pad by a solder layer.

6. The connection element of claim 1 wherein the second section of the first contact conductor has a passage extending from the first conductor surface to the second conductor surface.

7. The connection element of claim 1 wherein the electrically conductive structure is situated between the first and second main support surfaces.

8. The connection element of claim 1 wherein the first and second sections of the first conductor surface of the first contact conductor are oriented at a nonzero angle with respect to each other.

9. The connection element of claim 1 wherein the first contact conductor is defined by a flat metal strip, a metal foil, or a metal cuboid.

10. The connection element of claim 1 wherein the support is flexed such that the first contact pad and second contact pad are neither coplanar nor in parallel planes.

11. The connection element of claim 1 wherein the first contact conductor contacts the flexible circuit support only at:
a. the first section of the first conductor surface,
b. along a single continuous face of the flexible circuit support.

12. A process for producing a connection element for an electronic component assembly, the process including the steps of:
a. providing a flexible circuit support having:
  (1) a first main support surface,
  (2) a second main support surface opposite the first main support surface,
  (3) a first contact pad situated on one of the main support surfaces,
  (4) a second contact pad situated on one of the main support surfaces, and
  (5) an electrically conductive structure electrically connecting the first contact pad and the second contact pad;
b. providing a first contact conductor having:
  (1) a first conductor surface, and
  (2) a second conductor surface opposite the first conductor surface,
c. situating a first section of the first conductor surface adjacent the first contact pad; and
d. electrically connecting the first section of the first conductor surface to the first contact pad.

13. The process of claim 12 wherein the step of electrically connecting the first section of the first conductor surface to the first contact pad includes forming a solder layer between the first section of the first conductor surface and the first contact pad.

14. The process of claim 12:
a. wherein the step of situating the first section of the first contact conductor adjacent the first contact pad includes situating the first conductor surface of the first contact conductor to face the first contact pad; and
b. further including the step of reshaping the first contact conductor to orient a second section of the first conductor surface in a direction which does not face the first contact pad.

15. The process of claim 12 further including the steps of:
a. providing an electronic component having a contact point configured to form a welded connection; and
b. welding one of:
  (1) a second section of the first conductor surface, and
  (2) the second conductor surface,
  to the contact point.

16. The process of claim 15:
a. wherein the first contact conductor has a passage situated in its second section, the passage extending from the first conductor surface to the second conductor surface;
b. further including the step of laser welding the first contact conductor to the contact point through the passage.

17. The process of claim 12 further including the steps of:
a. providing a second contact conductor:
  (1) having:
    (a) a first conductor surface, and
    (b) a second conductor surface opposite its first conductor surface, (2) wherein the second contact conductor is configured to form a welded connection:
  (a) on a second section of its first conductor surface, and/or
  (b) on its second conductor surface;
b. situating a first section of the second contact conductor adjacent the second contact pad;
c. electrically connecting the first section of the first conductor surface of the second contact conductor to the second contact pad.

18. The process of claim 17 wherein the step of electrically connecting the first section of the first conductor surface of the second contact conductor to the second contact pad includes forming a solder layer between the first section of the first conductor surface of the second contact conductor and the second contact pad.

19. The process of claim 17 further including the step of connecting the second contact conductor with a contact pin of:
  a. a current source, or
  b. a voltage source,
  thereby forming an electrically conductive connection between the contact pin and the second contact conductor.

20. The process of claim 19 wherein the step of connecting the second contact conductor with the contact pin includes connecting the contact pin to:
  a. the second section of the first conductor surface of the second contact conductor, or
  b. the second conductor surface of the second contact conductor.

* * * * *